(12) United States Patent
Xu et al.

(10) Patent No.: US 12,514,062 B2
(45) Date of Patent: Dec. 30, 2025

(54) DISPLAY SUBSTRATES FOR FULL-SCREEN DISPLAY AND METHODS OF MANUFACTURING DISPLAY SUBSTRATE, DISPLAY PANELS, DISPLAY DEVICES

(71) Applicants: Beijing BOE Display Technology Co., Ltd., Beijing (CN); BOE Technology Group Co., Ltd., Beijing (CN)

(72) Inventors: Chuanxiang Xu, Beijing (CN); Shi Shu, Beijing (CN); Qi Yao, Beijing (CN); Guangcai Yuan, Beijing (CN); Haitao Huang, Beijing (CN); Xiang Li, Beijing (CN); Yong Yu, Beijing (CN); Yang Yue, Beijing (CN); Qingyu Huang, Beijing (CN)

(73) Assignees: Beijing BOE Display Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 620 days.

(21) Appl. No.: 17/780,701

(22) PCT Filed: Jun. 3, 2021

(86) PCT No.: PCT/CN2021/098198
§ 371 (c)(1),
(2) Date: May 27, 2022

(87) PCT Pub. No.: WO2021/259036
PCT Pub. Date: Dec. 30, 2021

(65) Prior Publication Data
US 2023/0011316 A1    Jan. 12, 2023

(30) Foreign Application Priority Data
Jun. 23, 2020    (CN) .......................... 202010582115.1

(51) Int. Cl.
*H10K 59/121*    (2023.01)
*H10K 59/38*    (2023.01)
(Continued)

(52) U.S. Cl.
CPC ........... *H10K 59/121* (2023.02); *H10K 59/38* (2023.02); *H10K 59/65* (2023.02);
(Continued)

(58) Field of Classification Search
CPC ...... H10K 50/85; H10K 50/828; H10K 59/38; H10K 71/00; H10K 2102/00; H10K 59/65;
(Continued)

(56) References Cited

U.S. PATENT DOCUMENTS

2012/0104422 A1* 5/2012 Lee .................. H10K 50/81
438/34
2016/0204371 A1* 7/2016 Kim .................. H10K 50/17
257/40
(Continued)

FOREIGN PATENT DOCUMENTS

CN    207338380 U    5/2018
CN    109801950 A    5/2019
(Continued)

OTHER PUBLICATIONS

CN2020105821151 first office action.
(Continued)

*Primary Examiner* — Mohammad M Hoque
(74) *Attorney, Agent, or Firm* — IPro, PLLC (57) ABSTRACT

A display substrate includes a base; and a first display region and a second display region disposed on the base, where a light transmittance of the first display region is greater than a light transmittance of the second display region, and the first display region includes one or more first sub-regions
(Continued)

and one or more second sub-regions; where the one or more first sub-regions include a plurality of first sub-pixels, and each of the first sub-pixels includes a first electrode disposed on the base, a light emitting layer disposed on the first electrode, and a second electrode disposed on the light emitting layer. A display panel, a display device and a method of manufacturing a display substrate are further disclosed.

9 Claims, 8 Drawing Sheets

(51) Int. Cl.
　　　H10K 59/65　　　(2023.01)
　　　H10K 59/80　　　(2023.01)
　　　H10K 102/00　　(2023.01)

(52) U.S. Cl.
　　　CPC ..... H10K 59/80524 (2023.02); H10K 59/875 (2023.02); H10K 59/8792 (2023.02); H10K 2102/00 (2023.02)

(58) Field of Classification Search
　　　CPC ........... H10K 59/80524; H10K 59/875; H10K 59/8792; H10K 71/60; H10K 59/121; H10K 59/60
　　　USPC .......................................................... 257/79
　　　See application file for complete search history.

(56) References Cited

U.S. PATENT DOCUMENTS

| | | | |
|---|---|---|---|
| 2016/0240811 A1* | 8/2016 | Kim | H10K 59/80524 |
| 2017/0213873 A1* | 7/2017 | Bok | H10K 59/40 |
| 2018/0180772 A1* | 6/2018 | Ji | G02B 1/11 |
| 2019/0305246 A1* | 10/2019 | Helander | H10K 50/828 |
| 2020/0194676 A1* | 6/2020 | Chang | H10K 85/6565 |
| 2020/0251539 A1 | 8/2020 | Fu | |
| 2021/0066418 A1* | 3/2021 | Seo | H10K 59/88 |
| 2021/0287610 A1* | 9/2021 | Kim | G09G 3/3266 |
| 2021/0320164 A1* | 10/2021 | Lee | G09G 3/3258 |
| 2021/0327972 A1 | 10/2021 | Lou et al. | |
| 2021/0408152 A1* | 12/2021 | Lou | H10K 59/80521 |
| 2021/0408174 A1 | 12/2021 | Chao et al. | |
| 2022/0029125 A1* | 1/2022 | Liu | H10K 59/121 |
| 2024/0049511 A1* | 2/2024 | Lv | H10K 59/80521 |
| 2025/0048878 A1* | 2/2025 | Lv | H10K 59/65 |

FOREIGN PATENT DOCUMENTS

| | | |
|---|---|---|
| CN | 110544433 A | 12/2019 |
| CN | 110767720 A | 2/2020 |
| CN | 111293235 A | 6/2020 |
| CN | 111682052 A | 9/2020 |

OTHER PUBLICATIONS

PCT/CN2021/098198 international search report.
PCT/CN2021/098198 written opinion of the international search authority.

* cited by examiner

DISPLAY SUBSTRATES FOR FULL-SCREEN DISPLAY AND METHODS OF MANUFACTURING DISPLAY SUBSTRATE, DISPLAY PANELS, DISPLAY DEVICES

CROSS-REFERENCE TO RELATED APPLICATIONS

This application is a national stage of international PCT Application No. PCT/CN2021/098198 filed on Jun. 3, 2021, the entire contents of which are incorporated herein by reference.

This disclosure claims priority to Chinese patent application No. 202010582115.1 entitled "DISPLAY SUBSTRATES AND METHODS OF MANUFACTURING DISPLAY SUBSTRATE, DISPLAY PANELS, DISPLAY DEVICES", filed with the Chinese Patent Office on Jun. 23, 2020, the entire contents of which are incorporated herein by reference.

TECHNICAL FIELD

Examples of the present disclosure relate to a display substrate and a method of manufacturing a display substrate, a display panel, a display device.

BACKGROUND

With the rapid development of electronic devices, users' requirements on a screen-to-body ratio becomes higher and higher, so that the full-screen display of electronic devices has received more and more attention in the industry.

Display screens in the prior art are provided with bang-shaped or drop-shaped notches or the like, and cameras are disposed in the notched regions. Alternatively, holes are made on the screens, and cameras are disposed in the holes. However, the regions where the cameras are disposed in these electronic devices cannot used to display such as a picture, so that these electronic devices do not have full screens in a true sense, and cannot display in all regions of the entire screen.

SUMMARY

At least one example of the present disclosure provides a display substrate, including: a base; and a first display region and a second display region disposed on the base, where a light transmittance of the first display region is greater than a light transmittance of the second display region, and the first display region includes one or more first sub-regions and one or more second sub-regions; where the one or more first sub-regions include a plurality of first sub-pixels, and each of the first sub-pixels includes a first electrode disposed on the base, a light emitting layer disposed on the first electrode, and a second electrode disposed on the light emitting layer.

In some examples of the present disclosure, the display substrate further includes a pattern layer, where the pattern layer is disposed in the one or more second sub-regions and configured to define positions of the second electrodes, where the pattern layer is made of a light transmitting material, and the light transmitting material and a material for the second electrodes are mutually exclusive.

In some examples of the present disclosure, the second electrodes are made of magnesium, and the material for the pattern layer includes at least one of bis(2-methyl-8-hydroxyquinoline)-4-(p-phenylphenol)aluminum or 3-(biphenyl-4-yl)-5-(4-tert-butylphenyl)-4-phenyl-4H-1,2,4-triazole.

In some examples of the present disclosure, the display substrate further includes a transparent conductive layer, where the transparent conductive layer is disposed in the first display region and electrically connected with the second electrodes.

In some examples of the present disclosure, the transparent conductive layer covers the first display region; and/or the transparent conductive layer is in direct contact with surfaces of the second electrodes away from or close to the base.

In some examples of the present disclosure, the first display region includes a plurality of the first sub-regions and a plurality of the second sub-regions that are alternately arranged; and for each of the first sub-regions, second electrodes of the first sub-pixels located in the first sub-region are connected with each other to form a surface electrode, and the display substrate further includes one or more connecting portions which are located in the second sub-regions and configured to electrically connect with adjacent surface electrodes.

In some examples of the present disclosure, the display substrate further includes a color filter, where the color filter is disposed in the first display region and the second display region and is located on a side of the second electrodes away from the base, where the color filter includes one or more black matrixes and one or more color films disposed in one or more opening of the black matrixes.

In some examples of the present disclosure, the color filter includes one or more hollow regions disposed in the one or more second sub-regions.

In some examples of the present disclosure, the display substrate further includes a transparent resin film layer, where the transparent resin film layer covers the one or more hollow regions, the one or more black matrixes and the one or more color films.

In some examples of the present disclosure, a density of the first sub-pixels in the one or more first sub-regions is lower than or equal to a density of second sub-pixels in the second display region.

At least one example of the present disclosure provides a method of manufacturing a display substrate, where the display substrate includes a first display region and a second display region, a light transmittance of the first display region is greater than a light transmittance of the second display region, and the first display region includes one or more first sub-regions and one or more second sub-regions; and where the method includes:
providing a base;
on the base, forming first electrodes in the one or more first sub-regions;
forming light emitting layers on the first electrodes; and
forming second electrodes on the light emitting layers, where the first electrodes, the light emitting layers and the second electrodes form first sub-pixels.

In some examples of the present disclosure, before forming the second electrodes on the light emitting layers, the method further includes:
forming a pattern layer in the one or more second sub-regions with a light transmitting material, where the light transmitting material and a material for the second electrodes are mutually exclusive.

In some examples of the present disclosure, the first display region includes a plurality of the first sub-regions and a plurality of the second sub-regions that are alternately arranged, and the second electrodes in the plurality of the first sub-regions are connected with each other to form surface electrodes; the method further includes: forming one or more connecting portions in the second sub-regions, where the one or more connecting portions are configured to electrically connect with adjacent surface electrodes, where the one or more connecting portions and the second electrodes are formed in one patterning process.

In some examples of the present disclosure, the method further includes:
  after forming the second electrodes, forming a transparent conductive layer in the first display region, where the transparent conductive layer is electrically connected with the second electrodes.

In some examples of the present disclosure, before forming the second electrodes, the method further includes forming a transparent conductive layer in the first display region, where the second electrodes are electrically connected with the transparent conductive layer.

In some examples of the present disclosure, after forming the second electrodes on the light emitting layers, the manufacturing method further includes:
  forming a color filter in the first display region and the second display region, where the color filter is located on a side of the second electrodes away from the base, and include one or more black matrixes, one or more color films disposed in one or more openings of the black matrixes, and one or more hollow regions, where the one or more hollow regions are located in the one or more second sub-regions.

In some examples of the present disclosure, the method further includes: forming a transparent resin film layer in the first display region, where the transparent resin film layer covers the one or more hollow regions, the one or more black matrixes and the one or more color films.

At least one example of the present disclosure provides a display panel, including the display substrate as described above.

At least one example of the present disclosure provides a display device, including the display panel as described above and one or more photosensitive devices, where the one or more photosensitive devices are disposed below the first display region.

The main technical effects achieved by the embodiments of the present disclosure are as follows.

According to the display substrate and manufacturing method thereof, the display panel, and the display device provided by the examples of the present disclosure, the light transmittance of the first display region is greater than that of the second display region, so that photosensitive devices such as a front camera and a fingerprint recognition sensor can be disposed below the first display region, which can realize the full-screen display of the display substrate on the premise of ensuring the normal operation of the photosensitive devices. In the first display region, the first electrodes and the second electrodes of the plurality of sub-pixels both are located in the one or more first sub-regions, while the one or more second sub-regions are provided with neither the first electrodes nor the second electrodes, so that the light transmittance of the one or more second sub-regions is higher, which can effectively improve the light transmittance of the first display region and ensure the normal operation of the photosensitive devices disposed below the first display region.

DETAILED DESCRIPTION OF THE EMBODIMENTS

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although terms "first," "second," "third," and the like may be used in the present disclosure to describe various information, such information should not be limited to these terms. These terms are only used to distinguish one category of information from another. For example, without departing from the scope of the present disclosure, first information may be referred as second information; and similarly, second information may also be referred as first information. Depending on the context, the word "if" as used herein may be interpreted as "when" or "upon" or "in response to determining".

Examples of the present disclosure provide a display substrate and a method of manufacturing a display substrate, a display panel, and a display device. The display substrate and manufacturing method thereof, the display panel, and the display device in the examples of the present disclosure will be described in detail below with reference to the drawings. In the case of no conflict, features in the following examples can be supplemented or combined with each other.

Figure 1:
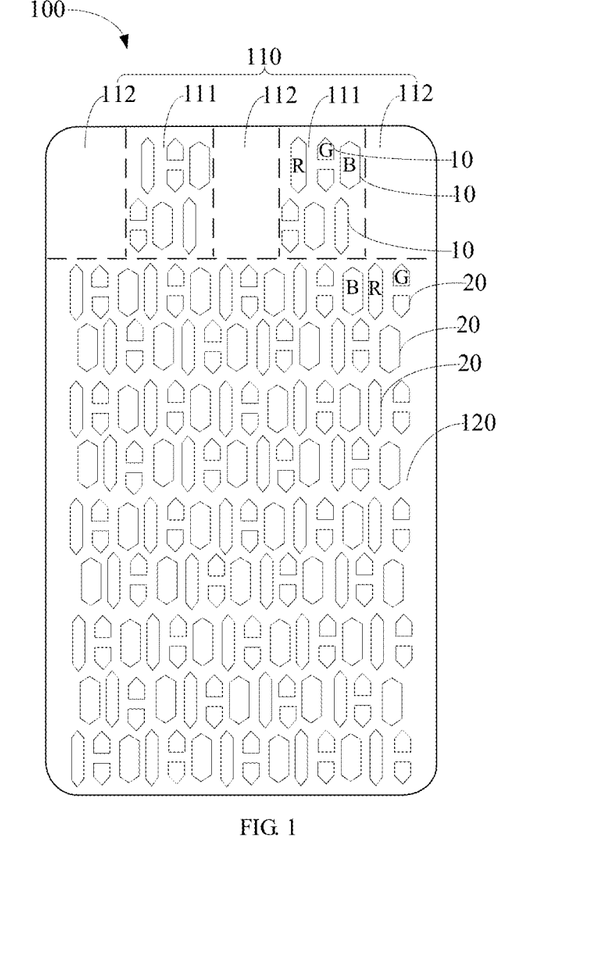
FIG. 1 is a top view illustrating a display substrate according to an example of the present disclosure.

At least one example of the present disclosure provides a display substrate. Referring to FIG. 1, a display substrate 100 includes a first display region 110 and a second display region 120, and a light transmittance of the first display region 110 is greater than that of the second display region 120. The first display region 110 includes one or more first sub-regions 111 and one or more second sub-regions 112.

Figure 2:
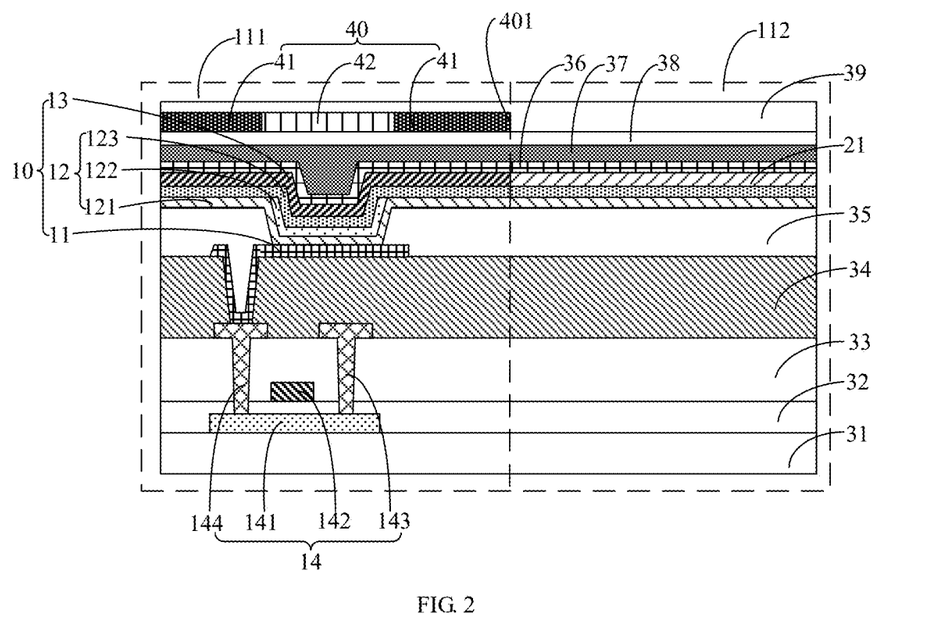
FIG. 2 is a local cross-sectional view illustrating a first display region of a display substrate according to an example of the present disclosure.

Referring to FIG. 2, the display substrate 100 includes a base 31. The first display region 110 is provided with a plurality of sub-pixels 10 located on a side of the base 31. Each of the plurality of sub-pixels 10 includes a first electrode 11, a light emitting layer 12 located on a side of the first electrode 11 away from the base 31, and a second electrode 13 located on a side of the light emitting layer 12 away from the base 31. The first electrodes 11 and the second electrodes 13 of the plurality of sub-pixels 10 both are located in the one or more first sub-regions 111.

In the display substrate 100 according to the examples of the present disclosure, the light transmittance of the first display region 110 is greater than that of the second display region 120, so that photosensitive devices such as a front camera and a fingerprint recognition sensor can be disposed below the first display region 110, which can realize the full-screen display of the display substrate 100 on the premise of ensuring the normal operation of the photosensitive devices. In the first display region 110, the first electrodes 11 and the second electrodes 13 of the plurality of sub-pixels 10 both are located in the one or more first sub-regions 111, while the one or more second sub-regions 112 are provided with neither the first electrodes nor the second electrodes, so that a light transmittance of the one or more second sub-regions 112 is higher, which can effectively improve the light transmittance of the first display region 110 and ensure the normal operation of the photosensitive devices disposed below the first display region 110.

In an example of the present disclosure, the base 31 may be a flexible base, which may be made of organic materials such as polyimide. In some examples of the present disclosure, the base 31 may be a rigid base, which may be made of materials such as glass, metal and plastic.

In the examples of the present disclosure, in the first display region 110, the first electrodes 11 of the plurality of sub-pixels 10 are located in the one or more first sub-regions 111, that is, the sub-pixels 10 in the first display region 110 are located in the one or more first sub-regions 111. During the display of the display substrate 100, the one or more first sub-regions 111 display images, and the one or more second sub-regions 112 do not display images.

In an example of the present disclosure, the first display region 110 includes a plurality of first sub-regions 111 and a plurality of second sub-regions 112, and the first sub-regions 111 and the second sub-regions 112 may be alternately arranged. In this way, the dispersion of the sub-pixels 10 in the first display region 110 is better, avoiding a situation in which, due to a larger area of certain second sub-region 112, a large region of the display substrate 100 does not display images during the display of the display substrate 100, improving the display effect, and helping to improve the user experience. FIG. 1 shows that the first display region 110 includes two first sub-regions 111 and three second sub-regions 112, but the arrangement manner of the first sub-regions 111 and the second sub-regions 112 in the first display region 110 shown in FIG. 1 is only illustrative. And in other examples of the present disclosure, the number and arrangement manner of the first sub-regions 111 and the second sub-regions 112 in the first display region 110 may be different from that in FIG. 1.

In the examples of the present disclosure, the plurality of sub-pixels 10 in the first display region 110 include sub-pixels with at least three colors. In the example shown in FIG. 1, the sub-pixels 10 in the first display region 110 include red sub-pixels R, green sub-pixels G, and blue sub-pixels B.

In an example of the present disclosure, the first electrodes 11 may be anodes, and the second electrodes 13 may be cathodes.

Figure 15:
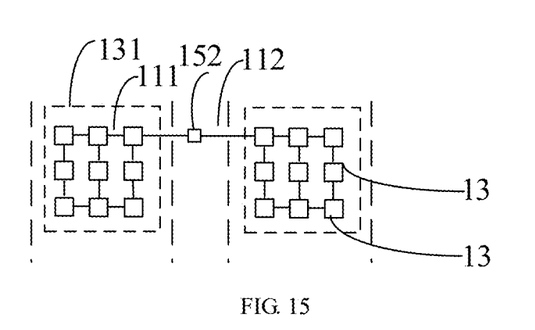
FIG. 15 is a schematic diagram illustrating a surface electrode according to an example of the present disclosure.

As shown in FIG. 15, for each of the one or more first sub-region 111 of the first display region 110, second electrodes 13 of a plurality of sub-pixels 10 in the first sub-region 111 may be connected with each other to form a surface electrode 131, and surface electrodes 131 in a plurality of first sub-regions 111 are connected with each other. In some examples of the present disclosure, the display substrate 100 further includes one or more connecting portions 152 disposed in the second sub-regions 112, and the one or more connecting portions 152 electrically connect/electrically connect with surface electrodes 131 in adjacent first sub-regions 111. A size of the one or more connecting portions 152 is small and far smaller than that of the one or more second sub-regions 112, and has little influence on the light transmittance of the one or more second sub-regions 112. By electrically connecting with the surface electrodes 131 in adjacent first sub-regions 111 through the one or more connecting portions 152, the second electrodes 13 of all sub-pixels 10 in the first display region 110 are electrically connected with each other, and can be grounded through a conductive wire, which helps to simplify the wiring complexity of the first display region 110 and improves the light transmittance of the first display region 110.

In an example of the present disclosure, the one or more connecting portions and the second electrodes 13 may be formed in one patterning process. Such arrangement helps to simplify preparation processes.

In an example of the present disclosure, the display substrate 100 may further include a pixel definition layer 35, and the pixel definition layer 35 has a plurality of pixel openings. The pixel openings located in the one or more first sub-regions 111 and the first electrodes 11 in the one or more first sub-regions 111 are in one-to-one correspondence, and the pixel openings expose corresponding first electrodes 11.

In an example of the present disclosure, the light emitting layer 12 includes a hole injection layer 121 located on a side of the first electrode 11 away from the base 31, an organic light emitting material layer 122 located on a side of the hole injection layer 121 away from the base 31, and an electron transport layer 123 located on a side of the organic light emitting material layer 122 away from the base 31.

The organic light emitting material layers 122 are located only in the one or more first sub-regions 111, and an organic light emitting material layer 122 is at least partially located in a corresponding pixel opening. The organic light emitting material layers 122 are not disposed in the one or more second sub-regions 112, which can prevent the organic light emitting material layers 122 from affecting the light transmittance of the one or more second sub-regions 112, and help to improve the light transmittance of the one or more second sub-regions 112.

In some examples of the present disclosure, as shown in FIG. 2, the hole injection layers 121 and the electron transport layers 123 can cover the one or more first sub-regions 111 and the one or more second sub-regions 112. Materials for the hole injection layers 121 and the electron transport layers 123 are light transmitting materials, which have little influence on the light transmittance of the one or more second sub-regions 112. In other examples of the present disclosure, the hole injection layers 121 and the electron transport layers 123 may be located only in the one or more first sub-regions 111.

In an example of the present disclosure, the display substrate 100 further includes a pattern layer 21 located in the one or more second sub-regions 112, and a material for the pattern layer 21 is a light transmitting material. The material for the pattern layer 21 and a material for the second electrodes 13 are mutually exclusive, and the pattern layer 21 is configured to define positions of the second electrodes 13, so that the second electrodes 13 are located only in the one or more first sub-regions 111. Before the second electrodes 13 are formed, the pattern layer 21 is first formed in the one or more second sub-regions 112. When the second electrodes 13 are subsequently formed, since the material for the pattern layer 21 and the material for the second electrodes 13 are mutually exclusive, the material for the second electrodes 13 will not be formed above the pattern layer 21. The material for the pattern layer 21 is a light transmitting material, and the provision of the pattern layer 21 has little influence on the light transmittance of the one or more second sub-regions 112.

In an example of the present disclosure, the material for the second electrodes 13 includes magnesium, and the material for the pattern layer 21 includes at least one of BAlq (bis(2-methyl-8-hydroxyquinoline)-4-(p-phenylphenol)aluminum) or TAZ (3-(biphenyl-4-yl)-5-(4-tert-butylphenyl)-4-phenyl-4H-1,2,4-triazole). The adhesion of magnesium on the BAlq and TAZ materials is poor, and the desorption energy is low. When magnesium is evaporated to form the second electrodes 13, the pattern layer 21 inhibits magnesium from forming a film on the pattern layer 21, so that magnesium can form a film only in regions where the pattern layer 21 is not disposed. In some examples of the present disclosure, a second sub-region 112 is not completely covered by the pattern layer 21, and when the second electrodes 13 are formed, a connecting portion is formed in a region of the second sub-region 112 not covered by the pattern layer 21.

Figure 3:
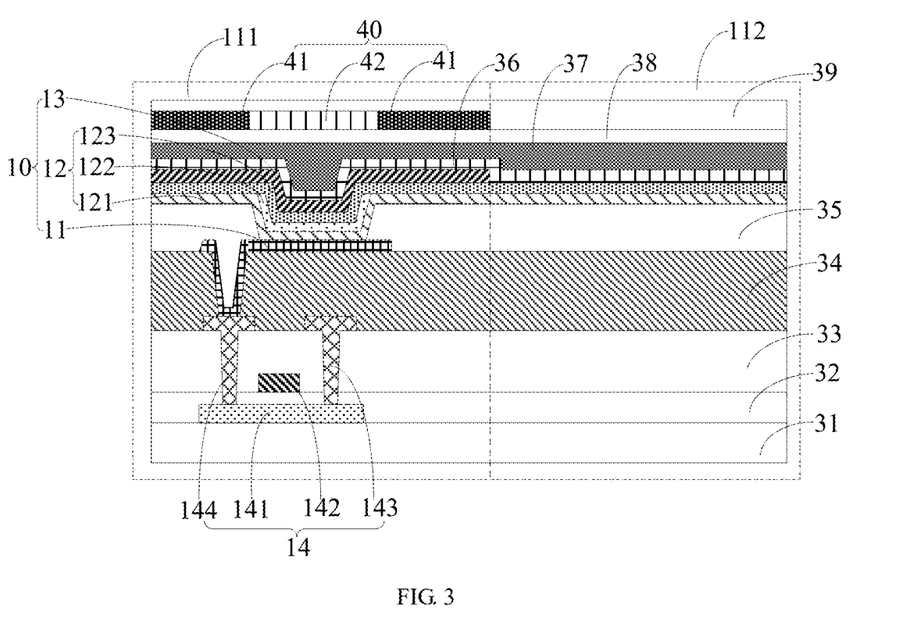
FIG. 3 is a local cross-sectional view illustrating a first display region of a display substrate according to another example of the present disclosure.

In other examples of the present disclosure, referring to FIG. 3, the display substrate 100 may not include the pattern layer 21. In a process of forming the second electrodes 13, a metal film layer covering the one or more first sub-regions 111 and the one or more second sub-regions 112 may be first formed, and then the metal film layer is etched to remove a part of the metal film layer located in the one or more second sub-regions 112.

Figure 4:
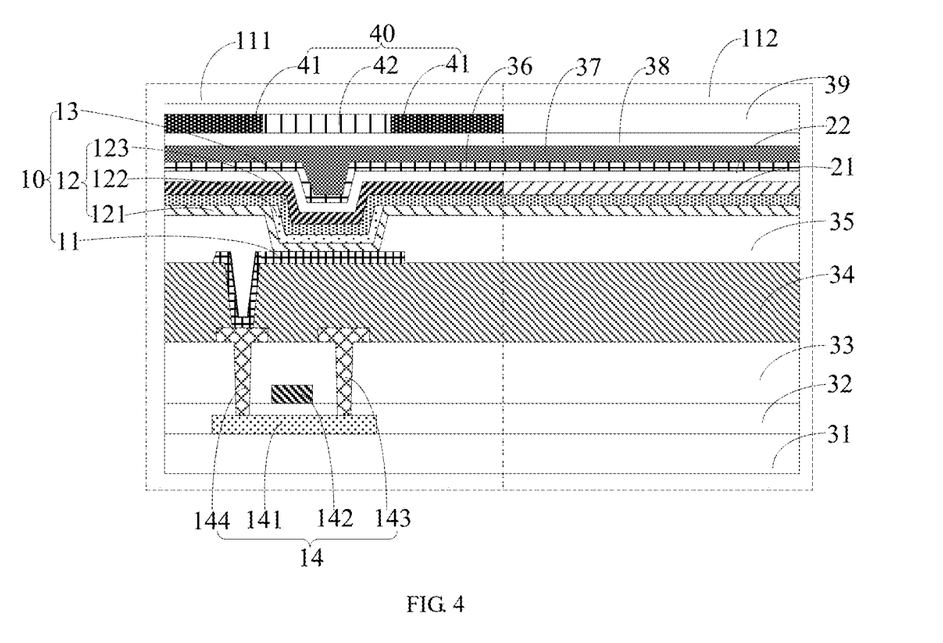
FIG. 4 is a local cross-sectional view illustrating a first display region of a display substrate according to still another example of the present disclosure.

In an example of the present disclosure, referring to FIG. 4, the display substrate 100 further includes a transparent conductive layer 22 located in the first display region 110, and the transparent conductive layer 22 and the second electrodes 13 are electrical connected with each other. By disposing the transparent conductive layer 22 electrically connected with the second electrodes 13, the transparent conductive layer 22 can reduce the resistance of the second electrodes 13, decrease the voltage drop on a layer of electrodes, and further reduce a current difference between a central region and an edge region of the display substrate 100, increasing the uniformity of display brightness in different regions of the display substrate, and helping to improve the user experience. The transparent conductive layer 22 is a light transmitting film layer, and the transparent conductive layer 22 has little influence on the light transmittance of the first display region 110. In an example of the present disclosure, the light transmittance of the transparent conductive layer 22 is greater than or equal to 75%.

In an example of the present disclosure, the transparent conductive layer 22 covers the first display region 110. In this way, an area of the transparent conductive layer 22 is relative larger, which helps to further reduce the resistance of the layer of electrodes.

In an example of the present disclosure, as shown in FIG. 4, the transparent conductive layer 22 is in direct contact with surfaces of the second electrodes 13 away from the base 31. In some examples of the present disclosure, the transparent conductive layer 22 may be in direct contact with surfaces of the second electrodes 13 close to the base 31.

In some examples of the present disclosure, a material for the transparent conductive layer 22 may include at least one of indium tin oxide or indium zinc oxide. In some examples of the present disclosure, the transparent conductive layer 22 may have a sandwich structure, including two molybdenum trioxide film layers and a silver film layer between the two molybdenum trioxide film layers, and a thickness of the transparent conductive layer 22 is 50 angstroms to 200 angstroms.

In an example of the present disclosure, referring to FIGS. 2 to 4, the display substrate 100 further includes a light extraction layer 36 located on a side of the second electrodes 13 away from the base 31. The provision of the light extraction layer 36 can improve the light output efficiency of the display substrate 100.

In some examples of the present disclosure, the display substrate 100 further includes an encapsulation layer 37. The encapsulation layer 37 is located on a side of the light extraction layer 36 away from the base 31. The encapsulation layer 37 can block water and oxygen in the air, and prevent the water and oxygen in the air from invading to light emitting layers of the sub-pixels 10, affecting the service life of the display substrate 100. In some examples of the present disclosure, the encapsulation layer 37 is Thin-Film Encapsulation (TFE) layer, and the TFE layer includes alternately stacked inorganic film layers and organic film layers. In an example of the present disclosure, the TFE layer includes two inorganic film layers and an organic film layer between the two inorganic film layers.

In an example of the present disclosure, the display substrate 100 further includes a touch layer 38. The touch layer 38 is located on a side of the encapsulation layer 37 away from the base 31.

In some examples of the present disclosure, as shown in FIGS. 2 to 4, the display substrate 100 further includes a color filter 40 located in the first display region 110 and the second display region 120, and the color filter 40 is located on a side of the second electrodes 13 away from the base 31. The color filter 40 includes one or more black matrixes 41 and one or more color films 42 disposed in one or more openings of the black matrixes 41. As shown in FIG. 3, the color filter 40 may be located on a surface of the touch layer 38 away from the base 31.

The one or more color films 42 of the color filter 40 include red color films, green color films, and blue color films, where the red color films correspond to the red sub-pixels R in a longitudinal direction, the green color films correspond to the green sub-pixels G in the longitudinal direction, and the blue color films correspond to the blue sub-pixels B in the longitudinal direction.

When ambient light incident on the display substrate 100 passes through the color filter 40, the color filter 40 will absorb a part of the light. For example, when the ambient light passes through the one or more black matrixes, the one or more black matrixes will absorb most of the light; when the ambient light passes through the one or more color films 42, each of the one or more color films 42 can absorb light with colors different from that of the color film. In this way, less ambient light enters the interior of the display substrate 100. Light that will enter the interior of ambient light is reflected by the metal film layer, and when the reflected light passes through the color filter 40, a part of the reflected light will be absorbed by the color filter 40, so that the amount of light finally emitted from the display substrate 100 is small. That is, the color filter 40 can reduce the reflectivity of the ambient light incident on the display substrate 100, which helps to improve the user experience. By disposing the color filter 40, it is not necessary to provide a circular polarizer on the display substrate 100. A light transmittance of the color filter 40 is greater than that of the circular polarizer, and compared with the solution of disposing the circular polarizer, the provision of the color filter 40 helps to further improve the light transmittance of the first display region 110.

In an example of the present disclosure, the color filter 40 includes one or more hollow regions 401, and the one or more hollow regions are located in the one or more second sub-regions 112. In this way, the provision of the color filter 40 will not affect the light transmittance of the one or more second sub-regions 112, and is more helpful to improve the light transmittance of the one or more second sub-regions 112.

In an example of the present disclosure, the display substrate 100 further includes a transparent resin film layer 39, and the transparent resin film layer 39 covers the one or more hollow regions, the one or more black matrixes 41 and the one or more color films 42 of the color filter 40. In this way, the transparent resin film layer 39 flattens the color filter 40, and can function to isolate water and oxygen so as to prevent the water and oxygen in the air from eroding the one or more black matrixes 41 and the one or more color films 42.

Referring to FIG. 1 again, a plurality of sub-pixels 20 are disposed in the second display region 120, and the plurality of sub-pixels 20 in the second display region 120 include sub-pixels with at least three different colors. In some examples of the present disclosure, the plurality of sub-pixels 20 in the second display region 120 include red sub-pixels R, green sub-pixels G, and blue sub-pixels B.

In some examples of the present disclosure, each of the plurality of sub-pixels 20 in the second display region 120 may include a third electrode, a light emitting material layer located on the third electrode, and a fourth electrode located on the light emitting material layer. The fourth electrodes of the sub-pixels 20 in the second display region 120 may be connected with each other to form a surface electrode. The surface electrode in the second display region 120 may be connected with the one or more surface electrodes in the one or more first sub-regions 111.

In some examples of the present disclosure, the third electrodes may be anodes, and the fourth electrodes may be cathodes.

In an example of the present disclosure, a density of the sub-pixels 10 in the one or more first sub-regions 111 may be lower than or equal to that of the sub-pixels 20 in the second display region 120. In this way, an area of metal in the one or more first sub-regions 111 can be made smaller, which helps to improve the light transmittance of the one or more first sub-regions 111.

In an example of the present disclosure, a driving mode of the sub-pixels 10 in the first display region 110 is an active driving mode/active matrix mode, and the display substrate 100 is further provided with pixel driving circuits for driving the sub-pixels 10. The pixel driving circuits and the sub-pixels 10 may be in one-to-one correspondence. The pixel driving circuits for driving the sub-pixels 10 may be disposed in the one or more first sub-regions 111 to prevent the pixel driving circuits from affecting the light transmittance of the one or more second sub-regions 112.

For each of the pixel driving circuits for driving the sub-pixels 10, the pixel driving circuit includes a thin film transistor. Referring to FIGS. 2 to 4, each thin film transistor 14 includes an active layer 141, a gate electrode 142, a first electrode portion 143 and a second electrode portion 144, and the second electrode portion 144 is electrically connected with the first electrode 11 of a corresponding sub-pixel 10. One of the first electrode portion 143 and the second electrode portion 144 is a source electrode, and the other one is a drain electrode.

In an example of the present disclosure, the display substrate 100 may further include a gate insulation layer 32, an interlayer dielectric layer 33 and a planarization layer 34. The gate insulation layer 32 is located between the active layers 141 and the gate electrodes 142. The interlayer dielectric layer 33 is located between the gate insulation layer 32 and the planarization layer 34. Partial regions of the first electrode portion 143 and the second electrode portion 144 are located in the interlayer dielectric layer 33 and the planarization layer 34, and are electrically connected with the active layer 141 through via holes penetrating the interlayer dielectric layer 33 and the gate insulation layer 32.

At least one example of the present disclosure provides a method of manufacturing a display substrate. A manufacturing process of the display substrate will be introduced below. "Patterning processes" referred to in the examples of the present disclosure include processes such as depositing a film layer, coating a photoresist, exposing a mask, developing, etching, and stripping a photoresist. Deposition may adopt any one or more of sputtering, evaporation and chemical vapor deposition, and etching may adopt either or both of dry etching and wet etching. "Thin film" refers to a thin film made of a material on a substrate by deposition or coating. If no patterning process is required for the "thin film" in the entire manufacturing process, the "thin film" can also be referred to as a "layer". When a patterning process is required for the "thin film" in the entire manufacturing process, it is referred to as a "thin film" before the patterning process, and a "layer" after the patterning process. The "layer" after the patterning process includes at least one "pattern".

Referring to FIG. 1, the display substrate 100 includes the first display region 110 and the second display region 120, and a light transmittance of the first display region 110 is greater than that of the second display region 120. The first display region 110 includes one or more first sub-regions 111 and one or more second sub-regions 112.

Figure 5:
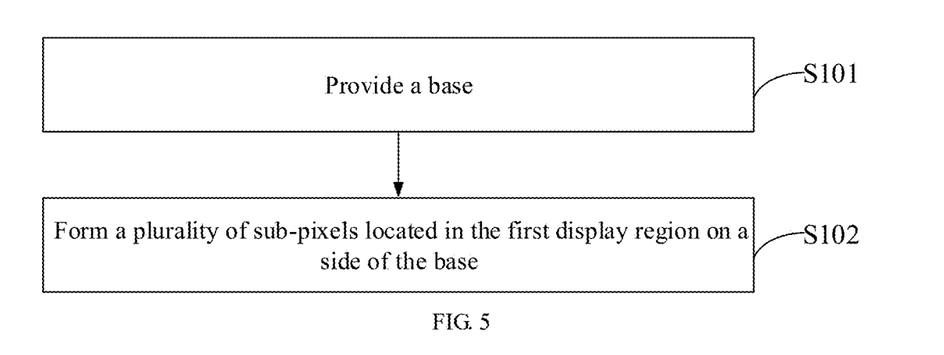
FIG. 5 is a flowchart illustrating a method of manufacturing a display substrate according to an example of the present disclosure.

Referring to FIG. 5, the method of manufacturing a display substrate includes the following steps 101 to 102.

S101, a base is provided.

In some examples of the present disclosure, the base may be a flexible base, and materials for the flexible base may be organic materials such as polyimide. In some examples of the present disclosure, the base may be a rigid base, and materials for the rigid base may be glass, metal, plastic, etc.

In some examples of the present disclosure, after the step S101, the method of manufacturing a display substrate further includes: forming pixel driving circuits on the base, where each of the pixel driving circuits includes a thin film transistor. The pixel driving circuits are located in the one or more first sub-regions 111, so that the pixel driving circuits will not affect the light transmittance of the one or more second sub-regions 112. In this way, a first intermediate structure as shown in FIG. 6 can be obtained.

Figure 6:
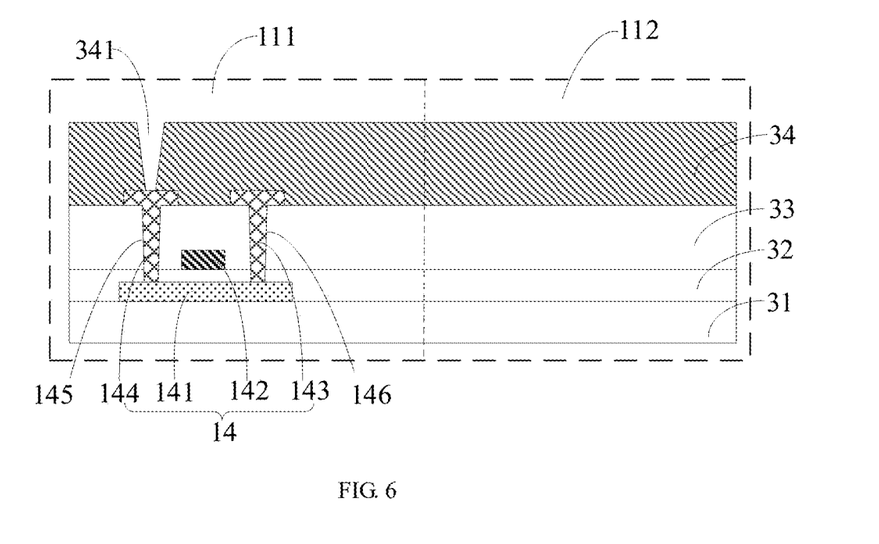
FIG. 6 is a local cross-sectional view illustrating a first intermediate structure of a display substrate according to an example of the present disclosure.

Referring to FIG. 6, each of the thin film transistors includes an active layer 141, a gate electrode 142, a first electrode portion 143 and a second electrode portion 144. One of the first electrode portion 143 and the second electrode portion 144 is a source electrode, and the other one is a drain electrode.

In an example of the present disclosure, the process of forming the pixel driving circuits on the base may include the following steps:

An active layer thin film is deposited on the base, and the active layer thin film is patterned through a patterning process to form active layers 141 located in the one or more first sub-regions 111.

Then, a gate insulation layer 32 and a first metal thin film are sequentially deposited, and the first metal thin film is patterned through a patterning process to form gate electrodes 142 located in the one or more first sub-regions 111.

Then, an interlayer dielectric layer 33 is deposited, and the gate insulation layer 32 and the interlayer dielectric layer 33 are etched to form via holes 145, 146 penetrating the gate insulation layer 32 and the interlayer dielectric layer 33 in the one or more first sub-regions 111.

Then, a second metal thin film is sequentially deposited, and the second metal thin film is patterned through a patterning process to form first electrode portions 143 and second electrode portions 144 located in the one or more first sub-regions 111, where respective first electrode portions 143 and respective second electrode portions 144 are electrically connected with respective active layers 141 respectively through the via holes 145 and 146.

Then, a planarization layer 34 is deposited, and the planarization layer 34 is etched to form contact holes 341 exposing the second electrode portions 144.

S102, a plurality of sub-pixels located in the first display region are formed on a side of the base.

Figure 7:
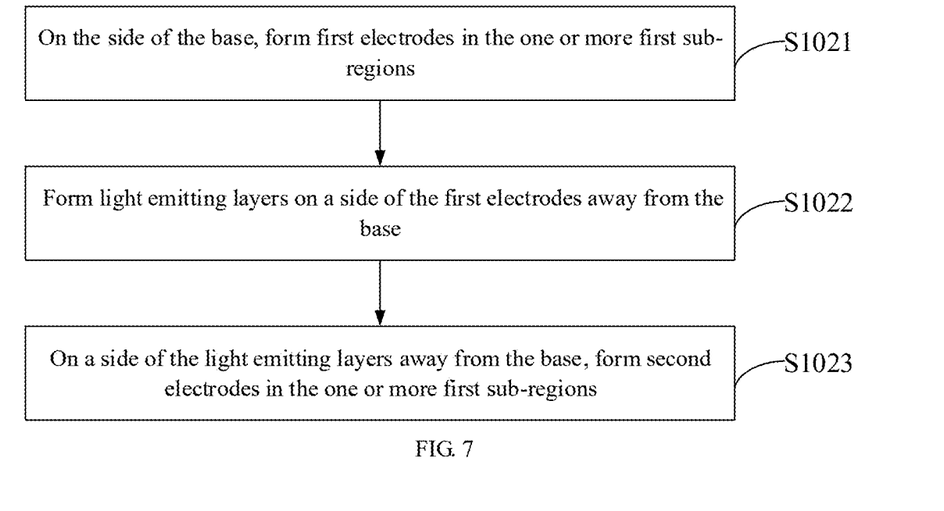
FIG. 7 is a flowchart of forming a plurality of sub-pixels located in a first display region according to an example of the present disclosure.

In an example of the present disclosure, referring to FIG. 7, the step S102 of forming the plurality of sub-pixels located in the first display region on the side of the base includes the following steps S1021 to S1023.

S1021, on the side of the base, first electrodes are formed in the one or more first sub-regions.

Figure 8:
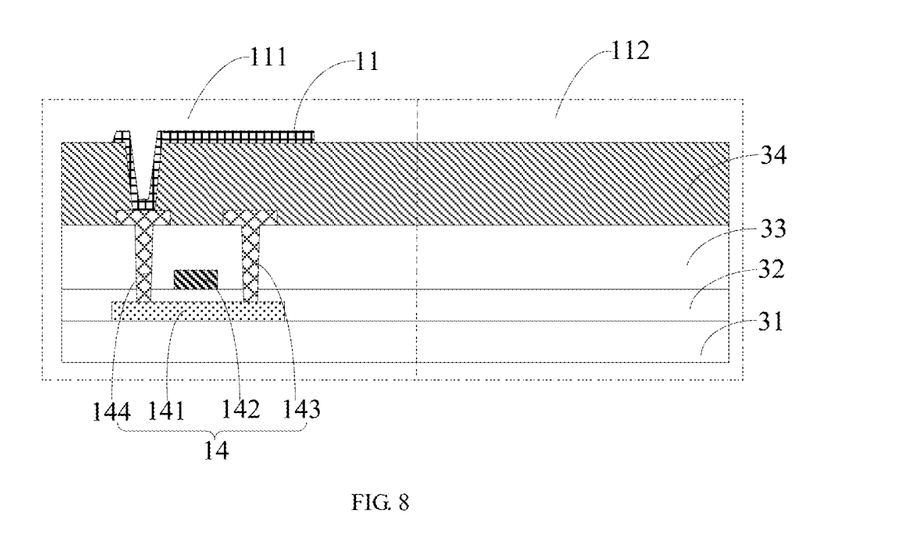
FIG. 8 is a local cross-sectional view illustrating a second intermediate structure of a display substrate according to an example of the present disclosure.

Through this step, a second intermediate structure as shown in FIG. 8 can be obtained.

The one or more first sub-regions 111 are provided with a plurality of first electrodes 11, and each first electrode 11 is electrically connected with the second electrode portion 144 of a thin film transistor 14 through a contact hole 341 of the planarization layer 34.

S1022, light emitting layers are formed on a side of the first electrodes away from the base.

Figure 9:
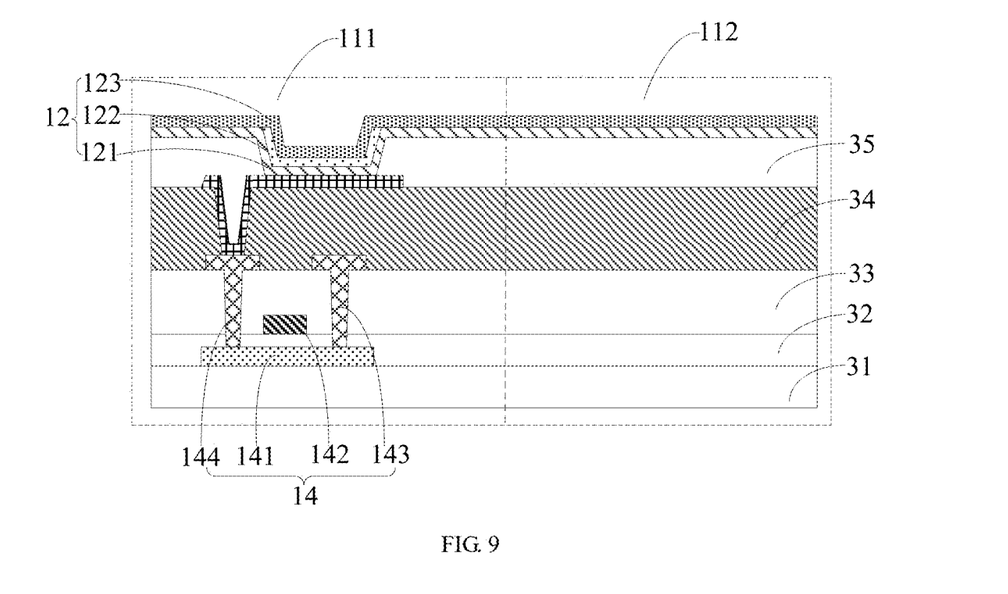
FIG. 9 is a local cross-sectional view illustrating a third intermediate structure of a display substrate according to an example of the present disclosure.

Through this step, a third intermediate structure as shown in FIG. 9 can be obtained.

Referring to FIG. 9, before the step S1022, the manufacturing method further includes: forming a pixel definition layer 35 on the first electrodes, where the pixel definition layer 35 covers the one or more first sub-regions 111, the one or more second sub-regions 112 and the second display region 120. The pixel definition layer 35 has pixel openings located in the one or more first sub-regions 111 and the second display region 120. The pixel openings located in the one or more first sub-regions 111 and the first electrodes 11 in the one or more first sub-regions 111 are in one-to-one correspondence, and the pixel openings expose corresponding first electrodes 11.

In an example of the present disclosure, the step S1022 of forming the light emitting layers on the side of the first electrodes away from the base includes: forming hole injection layers 121 on the side of the first electrodes 11 away from the base 31; forming organic light emitting material layers 122 on a side of the hole injection layers 121 away from the base 31; and forming electron transport layers 123 on a side of the organic light emitting material layers 122 away from the base 31.

The organic light emitting material layers 122 are located only in the one or more first sub-regions 111, and an organic light emitting material layer 122 is at least partially located in a corresponding pixel opening. The organic light emitting material layers 122 are not formed in the one or more second sub-regions 112, which can prevent the organic light emitting material layers 122 from affecting the light transmittance of the one or more second sub-regions 112. As shown in FIG. 9, the hole injection layers 121 and the electron transport layers 123 may cover the one or more first sub-regions 111 and the one or more second sub-regions 112. Materials for the hole injection layers 121 and the electron transport layers 123 are light transmitting materials, which have little influence on the light transmittance of the one or more second sub-regions 112. In some examples of the present disclosure, the hole injection layers 121 and the electron transport layers 123 may be located only in the one or more first sub-regions 111.

S1023, on a side of the light emitting layers away from the base, second electrodes are formed in the one or more first sub-regions.

In some examples of the present disclosure, the first display region 110 includes a plurality of first sub-regions 111 and a plurality of second sub-regions 112, and the first sub-regions 111 and the second sub-regions 112 are alternately arranged.

In some examples of the present disclosure, second electrodes 13 in one first sub-region 111 are connected with each other to form a surface electrode. The manufacturing method further includes: forming one or more connecting portions in the second sub-regions 112, where the one or more connecting portions are configured to electrically connect with surface electrodes in adjacent first sub-regions 111.

In some examples of the present disclosure, the one or more connecting portions and the second electrodes are formed in one patterning process. In this way, it is helpful to simplify the manufacturing processes of the display substrate.

In an example of the present disclosure, before the step S1023, the manufacturing method further includes: forming a pattern layer in the one or more second sub-regions, where the pattern layer is configured to define positions of the second electrodes. In some examples of the present disclosure, a material for the pattern layer is a light transmitting material, and the material for the pattern layer and a material for the second electrodes are mutually exclusive.

Figure 10:
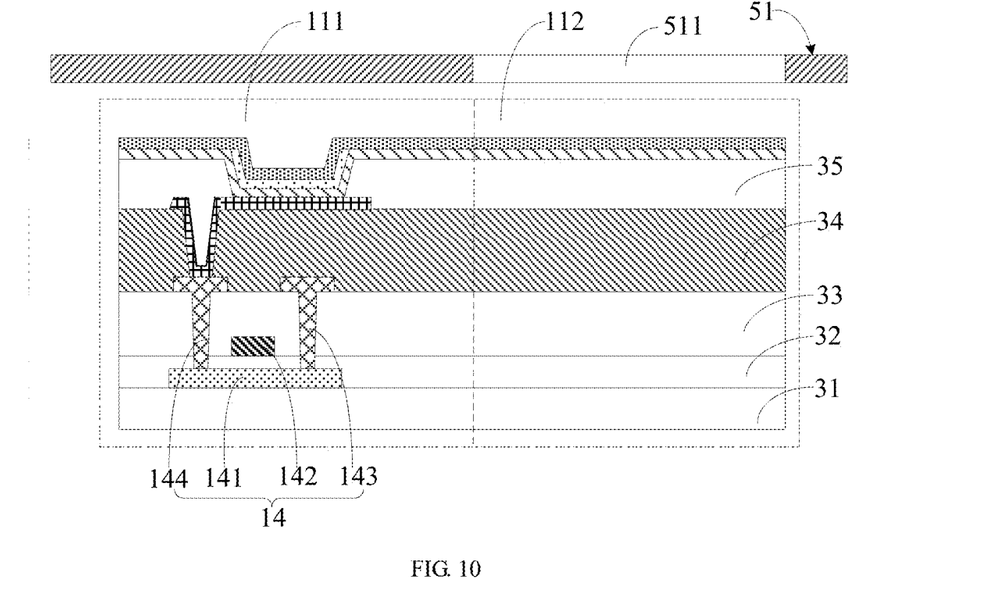
FIG. 10 is a schematic view illustrating a local structure of a first mask disposed on the third intermediate structure shown in FIG. 9.
Figure 11:
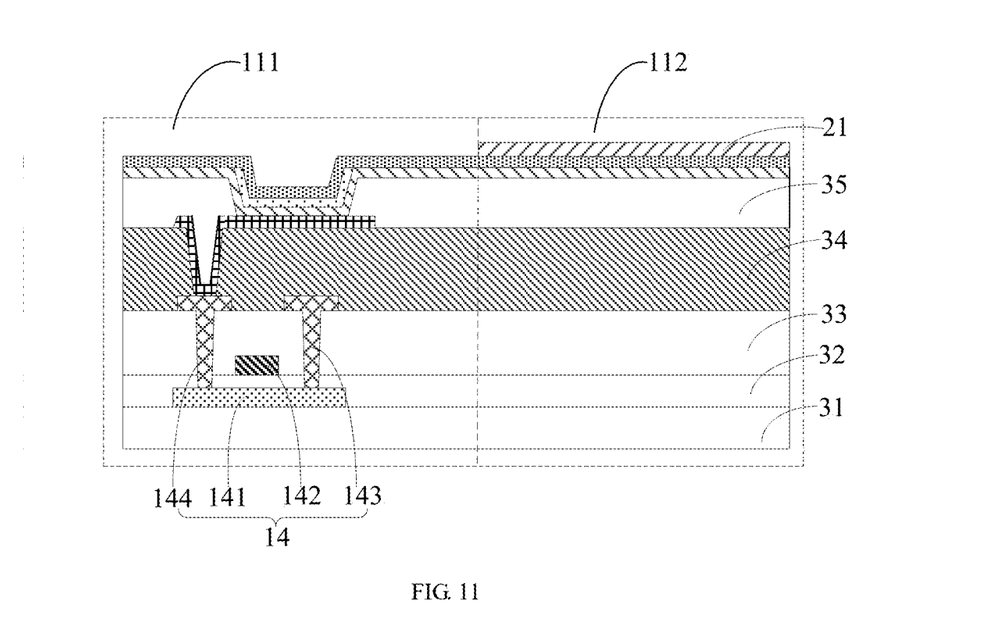
FIG. 11 is a local cross-sectional view illustrating a fourth intermediate structure of a display substrate according to an example of the present disclosure.

Referring to FIG. 10, in a process of forming the pattern layer, a first mask 51 is first placed on the light emitting layers 12, and the first mask is a Fine Metal Mask (FMM). The first mask 51 is provided with one or more first openings 511, and the one or more first openings correspond to the one or more second sub-regions 112. Subsequently, the pattern layer 21 is formed in the one or more second sub-regions 112 through the one or more first openings 511 of the first mask 51 to obtain a fourth intermediate structure as shown in FIG. 11.

Figure 12:
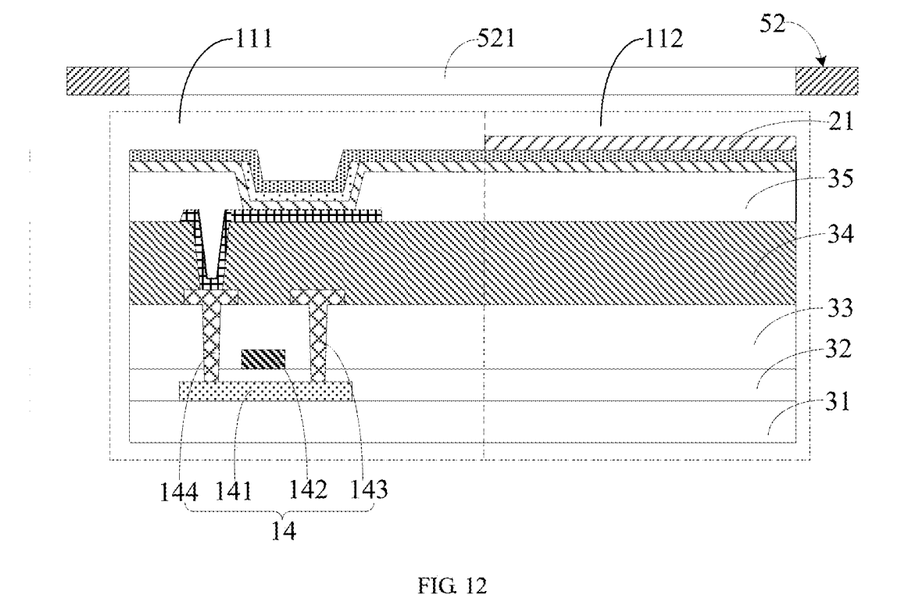
FIG. 12 is a schematic view illustrating a local structure of a second mask disposed on the fourth intermediate structure shown in FIG. 11.
Figure 13:
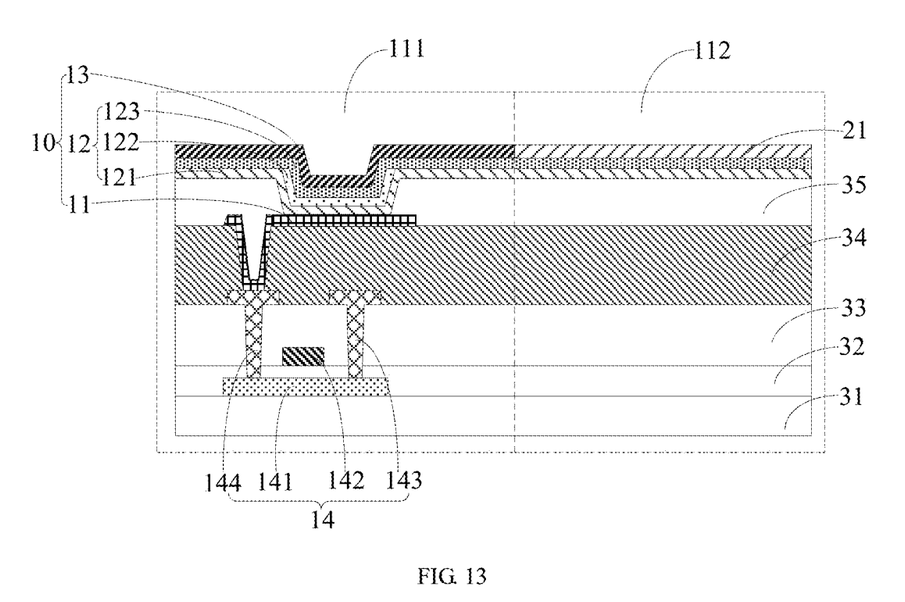
FIG. 13 is a local cross-sectional view illustrating a fifth intermediate structure of a display substrate according to an example of the present disclosure.

When the step S1023 is performed, referring to FIG. 12, a second mask 52 is first placed on a side of the fourth intermediate structure away from the base 31, and the second mask 52 is an open mask. The second mask 52 is provided with one or more second openings 521, and the one or more second openings 521 expose the one or more first sub-regions 111 and the one or more second sub-regions 112. Subsequently, the second electrodes 13 are formed through the second mask 52, and the second electrodes 13 will not be formed on the pattern layer 21. Through the step S1023, a fifth intermediate structure as shown in FIG. 13 can be obtained. In some examples of the present disclosure, a second sub-region 112 is not completely covered by the pattern layer 21, and when the second electrodes 13 are formed in the subsequent step S1023, a connecting portion can be simultaneously formed in a region of the second sub-region 112 not covered by the pattern layer 21.

The step S1023 is performed after the pattern layer 21 is formed. In the case of forming the second electrodes, the second electrodes are formed only in regions not covered by the pattern layer 21, and will not be formed on a side of the pattern layer 21 away from the base 31.

In an example of the present disclosure, the material for the second electrodes 13 includes magnesium, and the material for the pattern layer 21 includes at least one of BAlq (bis(2-methyl-8-hydroxyquinoline)-4-(p-phenylphenol)aluminum) or TAZ (3-(biphenyl-4-yl)-5-(4-tert-butylphenyl)-4-phenyl-4H-1,2,4-triazole). The adhesion of magnesium on the BAlq and TAZ materials is poor, and the desorption energy is low. When magnesium is evaporated to form the second electrodes 13, the pattern layer 21 inhibits magnesium from forming a film on the pattern layer 21, so that magnesium can form a film only in regions where the pattern layer 21 is not disposed.

In another example of the present disclosure, the display substrate 100 does not include the pattern layer. The step S1023 of forming the second electrodes on the side of the light emitting layers away from the base may include the following process:

a third mask is first placed on the light emitting layers 12, and the third mask is an FMM, where a region of the third mask corresponding to a first sub-region 111 is provided with a third opening, a region of the third mask corresponding to a second sub-regions 112 is provided with a fourth opening, and the fourth opening connects with adjacent third openings;

by evaporation, one or more surface electrodes covering the one or more first sub-regions 111 are formed in the one or more first sub-regions 111 through the one or more third openings, and one or more connecting portions electrically connecting with adjacent surface electrodes are formed in the one or more second sub-regions 112 through the one or more fourth openings.

In some examples of the present disclosure, the step S1023 of forming the second electrodes on the side of the light emitting layers away from the base may include the following process:

a third metal thin film covering the first display region 110 and the second display region 120 are first formed on the light emitting layers 12;

then, the third metal thin film is etched to remove a part of the third metal thin film located in the one or more second sub-regions 112. The third metal thin film may be etched by laser ablation.

Figure 14:
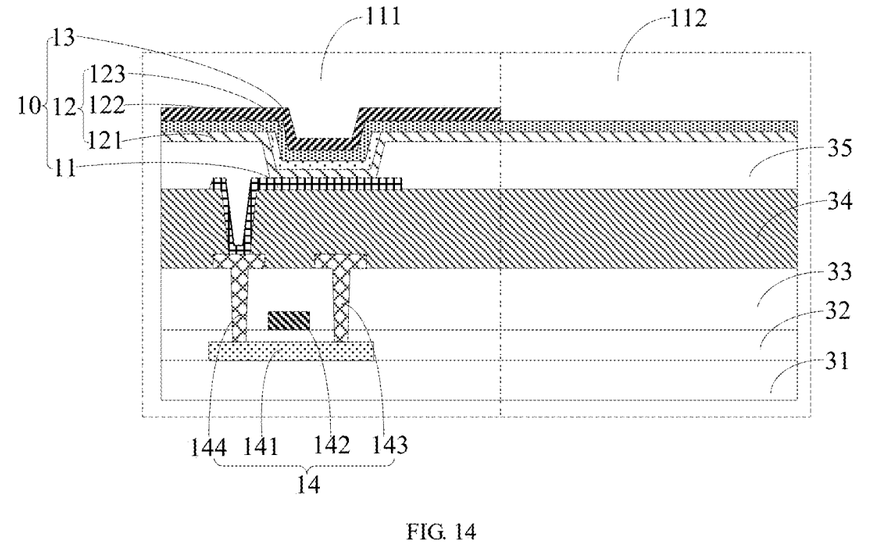
FIG. 14 is a local cross-sectional view illustrating a sixth intermediate structure of a display substrate according to an example of the present disclosure.

Through the above process, a sixth intermediate structure as shown in FIG. 14 can be obtained.

In an example of the present disclosure, referring to FIG. 4, the method further includes: forming a transparent conductive layer located in the first display region, where the transparent conductive layer is electrically connected with the second electrodes.

In some examples of the present disclosure, the transparent conductive layer 22 covers the first display region 110.

In some examples of the present disclosure, forming the second electrodes on the side of the light emitting layers away from the base is performed before forming the transparent conductive layer in the first display region, that is, the transparent conductive layer 22 is in direct contact with surfaces of the second electrodes 13 away from the base 31. In some examples of the present disclosure, forming the second electrodes on the side of the light emitting layers away from the base may be performed after forming the transparent conductive layer in the first display region, that is, the transparent conductive layer is in direct contact with surfaces of the second electrodes 13 close to the base 31.

In an example of the present disclosure, after, on the side of the base, forming the plurality of sub-pixels in the first display region, the method further includes: forming a color filter in the first display region and the second display region, where the color filter includes one or more black matrixes and one or more color films disposed in one or more openings of the black matrixes, and the color filter is located on a side of the second electrodes away from the base. Through this step, the display substrate as shown in FIGS. 2 to 4 is obtained.

In an example of the present disclosure, the color filter 40 includes one or more hollow regions, and the one or more hollow regions are located in the one or more second sub-regions.

In an example of the present disclosure, the manufacturing method further includes: forming a transparent resin film layer 39 located on a side of the color filter 40 away from the base 31 and in the one or more hollow regions, where the transparent resin film layer 39 covers the one or more hollow regions, one or more black matrixes 41 and one or more color films 42 of the color filter 40.

In an example of the present disclosure, the method further includes: forming a light extraction layer 36 on a side of the second electrodes 13 away from the base 31.

In an example of the present disclosure, the method further includes: forming an encapsulation layer 37 on a side of the second electrodes 13 away from the base 31. The encapsulation layer 37 may be located on a side of the light extraction layer 36 away from the base 31.

In an example of the present disclosure, the method further includes: forming a touch layer 38 on a side of the second electrodes 13 away from the base 31. The touch layer 38 may be located on a side of the encapsulation layer 37 away from the base 31.

At least one example of the present disclosure provides a method of manufacturing a display substrate. A light transmittance of a first display region 110 is greater than that of a second display region 120, so that photosensitive devices such as a front camera and a fingerprint recognition sensor can be disposed below the first display region 110, which can realize the full-screen display of a display substrate 100 on the premise of ensuring the normal operation of the photosensitive devices. In the first display region 110, first electrodes 11 and second electrodes 13 of a plurality of sub-pixels 10 both are located in the one or more first sub-regions 111, while one or more second sub-regions 112 are provided with neither the first electrodes nor the second electrodes, so that a light transmittance of the one or more second sub-regions 112 is higher, which can effectively improve the light transmittance of the first display region 110 and ensure the normal operation of the photosensitive devices disposed below the first display region 110.

For method examples, since they basically correspond to product examples, with regard to the description of their relevant details and beneficial effects, reference may be made to the partial description of the product examples, which will not be repeated.

At least one example of the present disclosure provides a display panel. The display panel includes any of the display substrates 100 as described above.

The display substrate 100 may further include a cover plate, and the cover plate is disposed on a side of the display substrate 100 away from the base 31. The cover plate may be a glass cover plate, which has a high light transmittance.

At least one example of the present disclosure provides a display device. The display device includes the above-mentioned display panel and one or more photosensitive devices, where the one or more photosensitive devices are disposed below the first display region. The one or more photosensitive devices can receive or emit light through the first display region.

The one or more photosensitive devices may include a front camera, a face recognition sensor, a fingerprint recognition sensor, and the like.

The display device may further include a housing, in which the display panel is embedded.

The display device provided by the examples of the present disclosure may be any device having a display function, such as a mobile phone, a tablet computer, a television and a notebook computer.

It should be pointed out that in the drawings, sizes of layers and areas may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. It will also be understood that when a layer or element is referred to as being "between" two layers or elements, it can be the only layer between the two layers or elements, or more than one intermediate layer or element may be present. Similar reference signs indicate similar elements throughout.

Other embodiments of the present disclosure will be readily apparent to those skilled in the art after considering the specification and practicing the contents disclosed herein. The present disclosure is intended to cover any variations, uses, or adaptations of the present disclosure, which follow the general principle of the present disclosure and include common knowledge or conventional technical means in the art that are not disclosed in the present disclosure. The specification and examples are to be regarded as illustrative only. The true scope and spirit of the present disclosure are pointed out by the following claims.

It is to be understood that the present disclosure is not limited to the precise structures that have described and shown in the drawings, and various modifications and changes can be made without departing from the scope thereof. The scope of the disclosure is to be limited only by the appended claims.

The invention claimed is:

1. A display substrate, comprising:
a base; and
a first display region and a second display region disposed on the base, wherein a light transmittance of the first display region is greater than a light transmittance of the second display region, and the first display region comprises one or more first sub-regions and one or more second sub-regions;
wherein the one or more first sub-regions comprise a plurality of first sub-pixels, and each of the plurality of first sub-pixels comprises a first electrode disposed on the base, a light emitting layer disposed on the first electrode, and a second electrode disposed on the light emitting layer;
a pattern layer, wherein the pattern layer is disposed in the one or more second sub-regions and configured to define positions of the second electrodes, wherein the pattern layer is made of a light transmitting material and formed before forming the second electrodes, and the light transmitting material and a material for the second electrodes are mutually exclusive;
wherein the second electrodes are made of magnesium, and the material for the pattern layer comprises at least one of bis(2-methyl-8-hydroxyquinoline)-4-(p-phenylphenol)aluminum or 3-(biphenyl-4-yl)-5-(4-tert-butylphenyl)-4-phenyl-4H-1,2,4-triazole;
wherein the one or more first sub-regions and the one or more second sub-regions are alternately arranged; and for each of the one or more first sub-regions, second electrodes of the plurality of first sub-pixels located in each of the one or more first sub-region are connected with each other to form a surface electrode, and the display substrate further comprises one or more connecting portions which are located in the one or more second sub-regions and configured to electrically connect with adjacent surface electrodes;
wherein the second sub-region is not completely covered by the pattern layer, the connecting portion is formed in a region of the second sub-region not covered by the pattern layer, and the second sub-region is not provided with the second electrode.

2. The display substrate according to claim 1, further comprising a transparent conductive layer, wherein the transparent conductive layer is disposed in the first display region and electrically connected with the second electrodes.

3. The display substrate according to claim 2, wherein the transparent conductive layer covers the first display region;

and/or the transparent conductive layer is in direct contact with surfaces of the second electrodes away from or close to the base.

4. The display substrate according to claim 1, further comprising a color filter, wherein the color filter is disposed in the first display region and the second display region and is located on a side of the second electrodes away from the base, wherein the color filter comprises one or more black matrixes and one or more color films disposed in one or more openings of the black matrixes.

5. The display substrate according to claim 4, wherein the color filter comprises one or more hollow regions disposed in the one or more second sub-regions.

6. The display substrate according to claim 5, further comprising a transparent resin film layer, wherein the transparent resin film layer covers the one or more hollow regions, the one or more black matrixes and the one or more color films.

7. The display substrate according to claim 1, wherein a density of the plurality of first sub-pixels in the one or more first sub-regions is lower than or equal to a density of a plurality of second sub-pixels in the second display region.

8. A display panel, comprising a display substrate, wherein the display substrate comprises:
   a base; and
   a first display region and a second display region disposed on the base, wherein a light transmittance of the first display region is greater than a light transmittance of the second display region, and the first display region comprises one or more first sub-regions and one or more second sub-regions;
      wherein the one or more first sub-regions comprise a plurality of first sub-pixels, and each of the plurality of first sub-pixels comprises a first electrode disposed on the base, a light emitting layer disposed on the first electrode, and a second electrode disposed on the light emitting layer;
   a pattern layer, wherein the pattern layer is disposed in the one or more second sub-regions and configured to define positions of the second electrodes, wherein the pattern layer is made of a light transmitting material and formed before forming the second electrodes, and the light transmitting material and a material for the second electrodes are mutually exclusive;
   wherein the second electrodes are made of magnesium, and the material for the pattern layer comprises at least one of bis(2-methyl-8-hydroxyquinoline)-4-(p-phenylphenol)aluminum or 3-(biphenyl-4-yl)-5-(4-tert-butylphenyl)-4-phenyl-4H-1,2,4-triazole;
   wherein the one or more first sub-regions and the one or more second sub-regions are alternately arranged; and for each of the one or more first sub-regions, second electrodes of the plurality of first sub-pixels located in each of the one or more first sub-region are connected with each other to form a surface electrode, and the display substrate further comprises one or more connecting portions which are located in the one or more second sub-regions and configured to electrically connect with adjacent surface electrodes;
   wherein the second sub-region is not completely covered by the pattern layer, the connecting portion is formed in a region of the second sub-region not covered by the pattern layer, and the second sub-region is not provided with the second electrode.

9. A display device, comprising:
a display panel according to claim 8, and
one or more photosensitive devices, wherein the one or more photosensitive devices are disposed below the first display region.

* * * * *